(12) United States Patent
Fulford et al.

(10) Patent No.: US 11,640,937 B2
(45) Date of Patent: May 2, 2023

(54) HORIZONTAL PROGRAMMABLE CONDUCTING BRIDGES BETWEEN CONDUCTIVE LINES

(71) Applicant: Tokyo Electron Limited, Tokyo (JP)

(72) Inventors: H. Jim Fulford, Marianna, FL (US); Mark I. Gardner, Cedar Creek, TX (US); Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 65 days.

(21) Appl. No.: 17/336,420

(22) Filed: Jun. 2, 2021

(65) Prior Publication Data

US 2021/0287980 A1 Sep. 16, 2021

Related U.S. Application Data

(62) Division of application No. 16/535,225, filed on Aug. 8, 2019, now Pat. No. 11,069,616.

(60) Provisional application No. 62/848,657, filed on May 16, 2019.

(51) Int. Cl.
*H01L 23/525* (2006.01)
*H01L 45/00* (2006.01)

(52) U.S. Cl.
CPC .......... *H01L 23/525* (2013.01); *H01L 45/065* (2013.01); *H01L 45/1226* (2013.01); *H01L 45/146* (2013.01)

(58) Field of Classification Search
CPC . H01L 23/525; H01L 45/065; H01L 45/1226; H01L 45/146
See application file for complete search history.

(56) References Cited

U.S. PATENT DOCUMENTS

| | | | |
|---|---|---|---|
| 7,605,079 B2 | 10/2009 | Lai et al. |
| 7,772,582 B2 | 8/2010 | Chen et al. |
| 7,880,157 B2 | 2/2011 | Chen et al. |
| 8,053,752 B2 | 11/2011 | Chen et al. |
| 8,071,971 B2 | 12/2011 | Lee |
| 8,389,967 B2 | 3/2013 | Chen et al. |
| 8,525,144 B2 | 9/2013 | Chen et al. |
| 10,644,067 B2 | 5/2020 | Reig et al. |
| 2007/0155172 A1 | 7/2007 | Lai et al. |

(Continued)

OTHER PUBLICATIONS

International Search Report and Written Opinion dated Jul. 13, 2020 in PCT/US2020/025935, 10 pages.

*Primary Examiner* — Marc Anthony Armand
(74) *Attorney, Agent, or Firm* — Oblon, McClelland, Maier & Neustadt, L.L.P.

(57) ABSTRACT

In a method for forming a semiconductor device, a plurality of conductive lines is formed as a part of a first wiring level of the semiconductor device. The first wiring level is positioned over a first level having a plurality of transistor devices. The plurality of conductive lines extends parallel to the first level. In addition, a programmable horizontal bridge is formed that extends parallel to the first level, and electrically connects a first conductive line and a second conductive line of the plurality of conductive lines in the first wiring level. The programmable horizontal bridge is formed based on a programmable material that changes phase between a conductive state and a non-conductive state according to a current pattern delivered to the programmable horizontal bridge.

15 Claims, 6 Drawing Sheets

(56) References Cited

U.S. PATENT DOCUMENTS

| | | |
|---|---|---|
| 2009/0014885 A1 | 1/2009 | Chen et al. |
| 2009/0101882 A1 | 4/2009 | Chen et al. |
| 2009/0291546 A1 | 11/2009 | Chen et al. |
| 2010/0038621 A1 | 2/2010 | Chen et al. |
| 2010/0108979 A1* | 5/2010 | Lee .................... H01L 45/1683 438/102 |
| 2011/0102016 A1 | 5/2011 | Chen et al. |
| 2019/0008872 A1 | 1/2019 | Liu et al. |

* cited by examiner

HORIZONTAL PROGRAMMABLE CONDUCTING BRIDGES BETWEEN CONDUCTIVE LINES

CROSS REFERENCE TO RELATED APPLICATIONS

This application is a divisional of U.S. patent application Ser. No. 16/535,225 filed on Aug. 8, 2019, which claims the benefit of U.S. Provisional Application No. 62/848,657 filed May 16, 2019. The entire contents of the above-identified applications are incorporated herein by reference in their entirety.

FIELD OF THE INVENTION

The disclosure relates to microelectronic devices including semiconductor devices, transistors, and integrated circuits, including methods of microfabrication.

BACKGROUND

Microelectronic devices typically have a layer or plane of devices such as transistors, which can be field effect transistors (FET). These transistors are wired together by using several wiring levels that are formed above these devices. Layers or planes in the wiring levels typically have horizontally running lines (also referred to as horizontal conducting lines, horizontal conductive lines, conductive lines). In between layers of horizontal conducting lines there are vertical interconnects (e.g., vias), which are essentially shorter lines to connect a given conductive line in one plane to a corresponding conductive line or device in another plane. A particular geometry and placement of vias and conductive lines is based on a circuit design for either logic or memory applications.

SUMMARY

In conventional circuits, making modifications to functionality of circuit elements after microfabrication has limitations. Currently in order to enable a new circuit element, a design needs to turn a transistor on or off to enable a particular data path. This means that power is needed at all times to keep (for example) an added circuit element on or off. When the added circuit element is powered up, the data to turn on or off a circuit block must be shorted in a hard code or by using non-volatile memory. If a designer wanted to connect a single path from a metal line (or a conductive line) to a different metal line (or a different conductive line), then a new photomask would be needed to make this connection. Moreover, if the designer wanted to remove a circuit then a new metal mask (photomask for a metal layer) would be needed to cut a particular metal line to create a short (or a connection). Adding new masks and custom masks to a microfabrication flow is expensive and slows throughput.

The present disclosure herein enhances 2D and 3D connections to logic circuits, memory elements, transistors and all circuit elements (with programing or programmable features) without constant modifications to photomasks. The present disclosure herein includes forming connections between horizontal conductive lines that can be turned on or off after microfabrication.

In one embodiment, horizontal conductive lines include one or more connections that are made by using a programmable material, such as a phase changeable material. The phase changeable material can be changed from conducting to non-conducting after microfabrication by using a pattern of current delivered to the phase changeable material. Accordingly any number of circuit elements can be shorted or connected after microfabrication. Accordingly, techniques herein eliminating the conventional need to make new photomasks and have complex data code stored in die to power on or off a circuit block. Being able to program horizontal connections between metal lines (or conductive lines) can be done after the die is placed in a package or in a system. This ability enables fast changes to circuit design functionality by turning on circuit blocks indefinitely or off indefinitely. Such functionality changes remain no matter a given device is powered or not powered. As can be appreciated, many benefits can be realized with such techniques. For example, power for operation can be reduced because no active circuit elements are needed to keep a new circuit block active each time a die is started and used.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device includes a first level having a plurality of transistor devices and a first wiring level positioned over the first level. The first wiring level includes a plurality of conductive lines extending parallel to the first level, and one or more programmable horizontal bridges extending parallel to the first level. Each of the one or more programmable horizontal bridges electrically connects two respective conductive lines of the plurality of conductive lines in the first wiring level. The one or more programmable horizontal bridges are formed based on a programmable material having a modifiable resistivity in that the one or more programmable horizontal bridges change between being conductive and being non-conductive.

In some embodiments, one of the one or more programmable horizontal bridges is further connected to a conductive vertical interconnect that is positioned below the one of the one or more programmable horizontal bridges and extends perpendicular to the first level.

The one or more programmable horizontal bridges can change between being conductive and non-conductive according to a current pattern delivered to the one or more programmable horizontal bridges. In some embodiments, the programmable material is a phase-changeable material that changes between being conductive and being non-conductive according to a current pattern delivered to the one or more programmable horizontal bridges. The current pattern can include a first current pattern to cause the phase-changeable material to become amorphous, and a second current pattern to cause the phase-changeable material to become crystalline.

In the disclosed semiconductor device, the programmable material fully fills each of the one or more programmable horizontal bridges. In addition, one of the one or more programmable horizontal bridges can replace a segment of one of the plurality of conductive lines.

In some embodiments, the one or more programmable horizontal bridges includes a first programmable horizontal bridge that is formed based on a first programmable material that changes resistivity in response to a third current pattern, and a second programmable horizontal bridge that is formed based on a second programmable material that changes resistivity in response to a fourth current pattern.

In the disclosed semiconductor device, sidewalls of one of the one or more programmable horizontal bridges protrude from sidewalls of one of the plurality of the conductive lines that is connected to the one of the one or more programmable horizontal bridges.

In the disclosed semiconductor device, each of the one or more programmable horizontal bridges is positioned at a respective location to toggle a predetermined function of a corresponding integrated circuit.

According to another aspect of the disclosure, a method for forming a semiconductor device is provided. In the disclosed method, a plurality of conductive lines are formed as a part of a first wiring level of the semiconductor device. The first wiring level is positioned over a first level having a plurality of transistor devices. The plurality of conductive lines extend parallel to the first level. In addition, a programmable horizontal bridge is formed that extends parallel to the first level, and electrically connects two of the plurality of conductive lines in the first wiring level. The programmable horizontal bridge is formed based on a programmable material that changes phase between a conductive state and a non-conductive state according to a current pattern delivered to the programmable horizontal bridge.

In some embodiments, a relief pattern is formed in a dielectric material that is positioned over a substrate. The relief pattern has a plurality of trenches. Further, the programmable material is deposited to fill one of the plurality of trenches of the relief pattern. A portion of the programmable material is then covered through a first mask. A uncovered portion of the programmable material is subsequently removed so that one or more trenches segments are formed in the one of the plurality of trenches. The first mask is then removed and the one or more trench segments are filled with a conductive material.

In an embodiment, the programmable material can be deposited in a crystalline state. In another embodiment, the programmable material can be deposited in an amorphous state.

In some embodiments, a relief pattern is formed in a dielectric material positioned over a substrate. The relief pattern has a plurality of trenches. The plurality of trenches are the filled with a conductive material to form the plurality of conductive lines. Further, one trench segment is formed between the two of the plurality of conductive lines, and the one trench segment is filled with the programmable material to form the programmable horizontal bridge that connects the two of the plurality of conductive lines in the first wiring level.

In the disclosed method, the conductive material is deposited in a plurality of trenches to form the plurality of conductive lines, and the programmable material is deposited in a trench segment for form a programmable horizontal bridge to physically connect two conductive lines of the plurality of conductive lines. In some embodiments, depositing the programmable material in the trench segment includes removing a sacrificial material that fills the trench segment and replacing the sacrificial material with the programmable material.

In yet another aspect of the disclosure, a method for operating a semiconductor device is provided. In the disclosed method, the semiconductor device is accessed. The semiconductor device has a first level including a plurality of transistor devices and a first wiring level positioned over the first level. The first wiring level includes a plurality of conductive lines extending parallel to the first level, and one or more programmable horizontal bridges extend parallel to the first level. Each of the one or more programmable horizontal bridges electrically connects two respective conductive lines of the plurality of conductive lines in the first wiring level, where the one or more programmable horizontal bridges includes a programmable material having a modifiable resistivity in that the one or more programmable horizontal bridges change between being conductive and being non-conductive.

Further, in the disclosed method, a specific circuit function is identified to operate the one or more programmable horizontal bridges accordingly by transmitting a current pattern to the one or more programmable horizontal bridges.

In some embodiments, a first specific circuit function is identified to deactivate the one or more programmable horizontal bridges by transmitting a first current pattern to the one or more programmable horizontal bridges. The first current pattern causes the one or more programmable horizontal bridges to change from being conductive to being non-conductive, such that the specific circuit function is deactivated.

In some embodiments, a second specific circuit function is identified to activate the one or more programmable horizontal bridges by transmitting a second current pattern to the one or more programmable horizontal bridges. The second current pattern causes the one or more programmable horizontal bridges to change from being conductive to being non-conductive, such that the specific circuit function is activated.

In some embodiments, a third specific circuit function is identified to deactivate the one or more programmable horizontal bridges by transmitting a third current pattern to the one or more programmable horizontal bridges. The third current pattern causes the one or more programmable horizontal bridges to change from being non-conductive to being conductive, such that the specific circuit function is deactivated.

In some embodiments, a fourth specific circuit function is identified to activate the one or more programmable horizontal bridges by transmitting a fourth current pattern to the one or more programmable horizontal bridges. The fourth current pattern causes the one or more programmable horizontal bridges to change from being non-conductive to being conductive, such that the specific circuit function is activated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
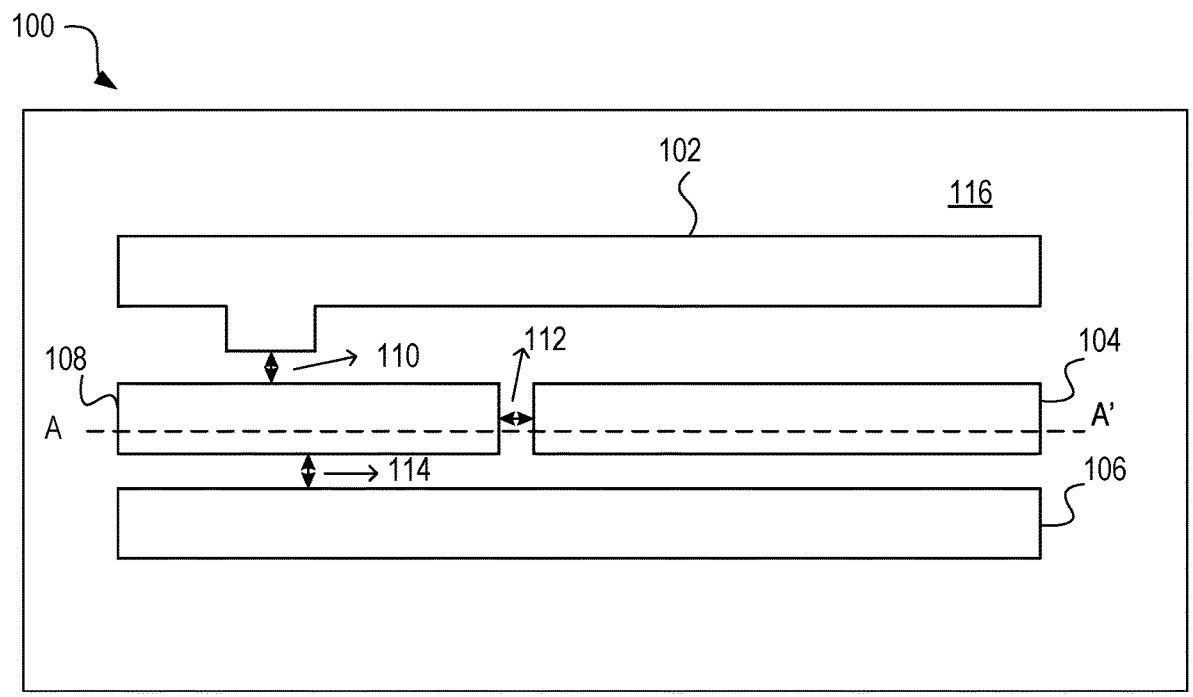
FIG. 1 is a top down view of an exemplary substrate segment including conductive lines, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein include forming programmable connections (also referred to programmable bridges, programmable horizontal bridges) between horizontal conductive lines or wires that can be turned on or off after microfabrication. The horizontal conductive lines typically extend in a plane that is a parallel to a layer or plane of transistor devices of a circuit. For example, microelectronic circuits typically include multiple levels or planes of conductive lines that are interconnected and that include vertical interconnects (e.g., vias) to connect conductive lines in a given plane to conductive lines in another plane. These vias are vertical in that they typically extend perpendicular to planes of conductive lines (or metal layers) as well as a level of transistor devices. In one embodiment, the programmable connections include one or more connections made using a programmable material, such as a phase-changeable material. The phase-changeable material can be changed from conducting material to non-conducting material after microfabrication by using a pattern of current delivered to the programmable connections (phase-changeable material). Accordingly, any number of circuit elements can be shorted or electrically connected after microfabrication.

As such, techniques herein eliminate the conventional need to make new photomasks and have complex data code stored in die to power on or off a circuit block. Being able to program horizontal interconnects between metal lines (or conductive lines) can be done after a corresponding die is placed in a package or in a system. This ability enables fast changes to circuit design functionality by turning on circuit blocks indefinitely or turning off circuit blocks indefinitely. Such functionality changes remain whether a given device is powered or not powered. As can be appreciated, many benefits can be realized with such techniques. For example, a power for operation can be reduced because no active circuit elements are needed to keep a new circuit block active each time when a die is started and used.

Methods of forming horizontal programmable conducting bridges (also referred to as programmable horizontal bridges) between conductive lines can be integrated into conventional metallization process flows. For example, in one process flow, a metal layer (or wiring level) is created. This metal layer can be created by a way of a single damascene or dual damascene. Metal (or a conductive material) can be deposited, masked, and etched. Conductive liners can be optionally added. A phase-changeable material can be deposited in all trenches and then selectively masked to cover a portion of the phase-changeable material that needs to be kept, while an uncovered portion of the phase-changeable material is removed. Then the conductive material can be deposited in uncovered trenches. Alternatively, metal lines (or conductive lines) are formed first, and then phase-changeable material is deposited in trenches or openings that are created or are selectively masked or filled with a replaceable/sacrificial material.

The phase-changeable material is a material that can change its physical properties to be either conductive or non-conductive (resistive or insulating). Example materials include InSe, SbSe, SbTe, InSbSe, InSbTe, GeSbSe, GeSbTeSe and AgIn InSe, SbSe, SbTe, InSbSe, InSbTe, GeSbSe, GeSbTeSe, AgIn, Ag2Se, Ge2Se3, GeSb, Ge2Sb2, GeSbTeN, and Ge2Sb2Te5. These materials are phase-changeable in that a molecular structure can be changed between being amorphous and crystalline in response to a particular current pattern delivered to these materials. A liner material can optionally be used to hold or help contain the phase-changeable materials. Example liner materials include TiN, TaN, Ta, TiW, Ti, Ru, Au, W, Cu, Pt, CoSi2, NiSi2, TiSi2, Mo, Al, CuAl, and CuMn.

FIG. 1 is a top down view of an example substrate segment 100 that includes a plurality of conductive lines 102-108. The conductive lines can be positioned over a substrate 101 (referring to FIG. 3) and can be made of tungsten, copper, ruthenium, cobalt, aluminum, or other suitable conductive materials. Note that there are also gaps between conductive lines. For example, three gaps 110-114 are included in FIG. 1. These gaps can be line segments or trench segments that are designed to have no conductive material deposited in those locations (by masking and/or using dummy/sacrificial material). A dielectric layer 116 can be formed to separate the conductive lines from one another. The dielectric layer 116 can be a SiO, SiN, or other suitable dielectric materials.

Figure 2:
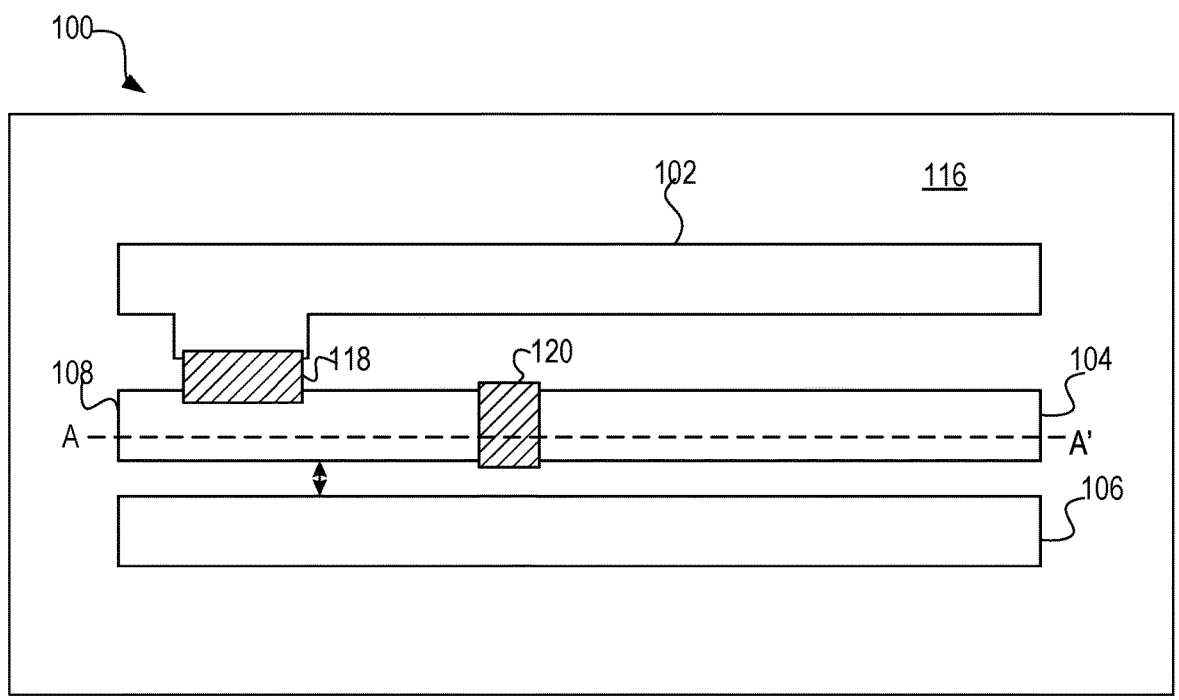
FIG. 2 is a top down view of an exemplary substrate segment including conductive lines and programmable horizontal bridges, in accordance with some embodiments

FIG. 2 is a top down view of the substrate segment 100 after a programmable material is added so that one or more programmable horizontal bridges are formed. As shown in FIG. 2, two programmable horizontal bridges 118 and 120 are formed at locations of the gaps 110 and 112. The programmable horizontal bridge 118 connects the conductive lines 108 and 110, and the programmable horizontal bridge 120 connects the conductive lines 104 and 108. In order to form the programmable horizontal bridges 118 and 120, the gaps (line segments or trench segments) 110-112 can be formed through a photomask (not shown) and an etching process. The photomask can further be used to function as a keep mask that limits deposition of the programmable material to specific areas (e.g., gaps 110-112) to create programmable horizontal bridges 118-120 that physically connect or bridge two conductive lines respectively. Note that a programmable horizontal bridge (e.g., 118) can be positioned between two parallel lines, or a programmable horizontal bridge (e.g., 120) can extend along a single line path.

Figure 3:
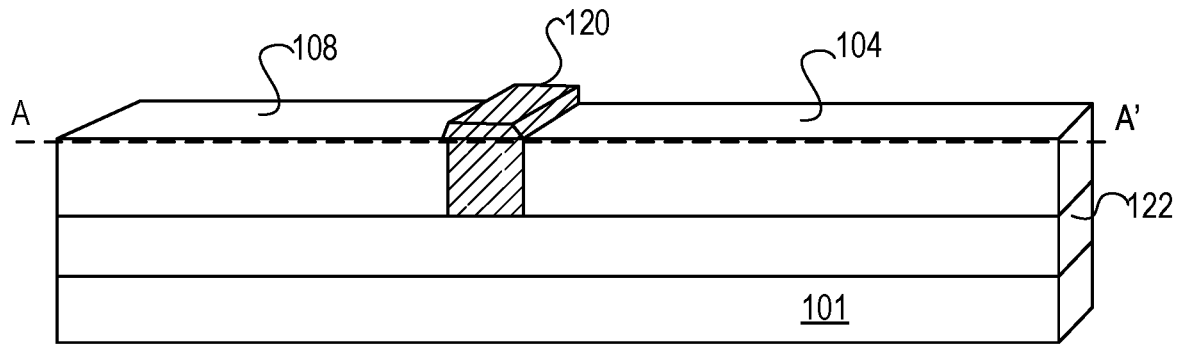
FIG. 3 is a side cross-sectional view of an exemplary substrate segment including programmable horizontal bridges, in accordance with some embodiments.

FIG. 3 is a side cross-sectional view of the substrate segment 100, which is obtained from a line A-A' along a direction perpendicular to a top surface of the substrate segment 100 in FIG. 2. As shown in FIG. 3, the substrate segment 100 can include a substrate 101. The substrate 101 may include a silicon (Si) substrate, a germanium (Ge) substrate, a silicon germanium (SiGe) substrate, and/or a silicon-on-insulator (SOI) substrate. Over the substrate 101, an insulation layer 122 can be formed. The insulation layer 122 can be made of SiO, SiN, or other suitable dielectric materials. The conductive lines 104 and 108, and the programmable horizontal bridge 120 are formed over the insulation layer 122, where the programmable horizontal bridge 120 connects the conductive lines 104 and 108.

Figure 4:
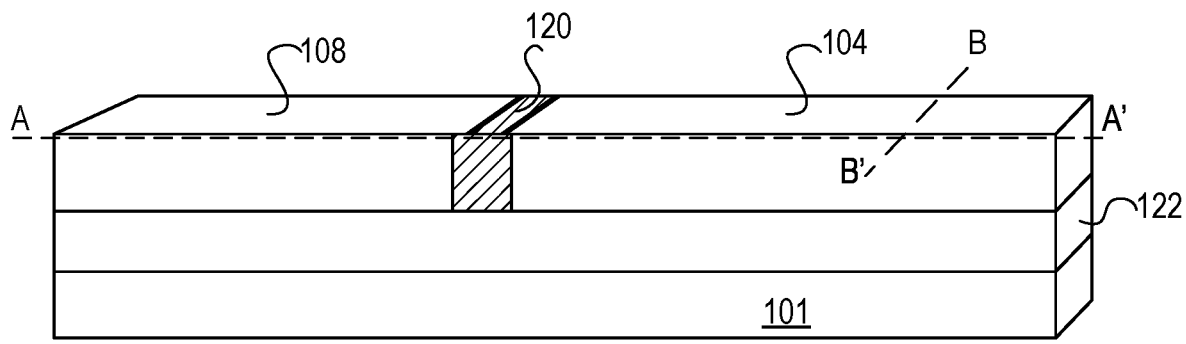
FIG. 4 is another side cross-sectional view of an exemplary substrate segment including programmable horizontal bridges, in accordance with some embodiments.

In some embodiments, a given metal layer (or wiring level) is formed with openings (or gaps, line segments, trench segments) for depositing phase-changeable material to fill the trench segments, and then a blanket etch back or chemical-mechanical planarization (CMP) is executed to remove any overburden of the phase-changeable material over the conductive lines. FIG. 4 illustrates a side cross-sectional view of substrate segment 100, where the programmable horizontal bridge 120 is planarized so that a top surface the programmable horizontal bridge 120 is level with top surface of the conductive lines 104 and 108. Upon completion of the surface planarization process, a wiring level, such as a first wiring level, is formed that is arranged over the insulation layer 122, and includes the conductive lines 104 and 108, and the programmable horizontal bridge 120.

Figure 5:
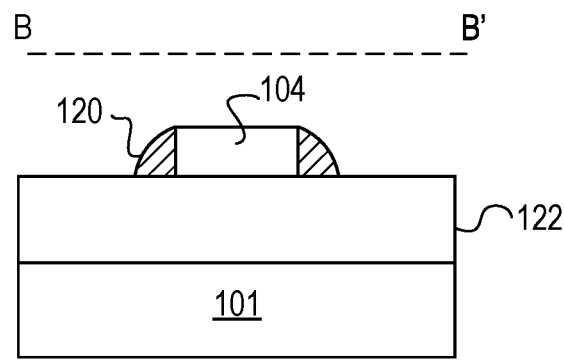
FIG. 5 is a cross-sectional view of an exemplary substrate segment including programmable horizontal bridges, in accordance with some embodiments.

Note that if the conductive lines have exposed sidewalls, the phase-changeable material can be deposited on sidewalls or remained on sidewalls after an initial blanked etch to remove an overburden that is mentioned in FIG. 4. FIG. 5 illustrates a cross-sectional view of the phase-changeable material that remains on sidewalls of the conductive line 104 after the blanket etch back or CMP to remove any overburden of the phase-changeable material over the conductive lines 104 and 108. FIG. 5 is obtained from a line B-B' along a direction perpendicular to the conductive line 104 in FIG. 4.

Figure 6:
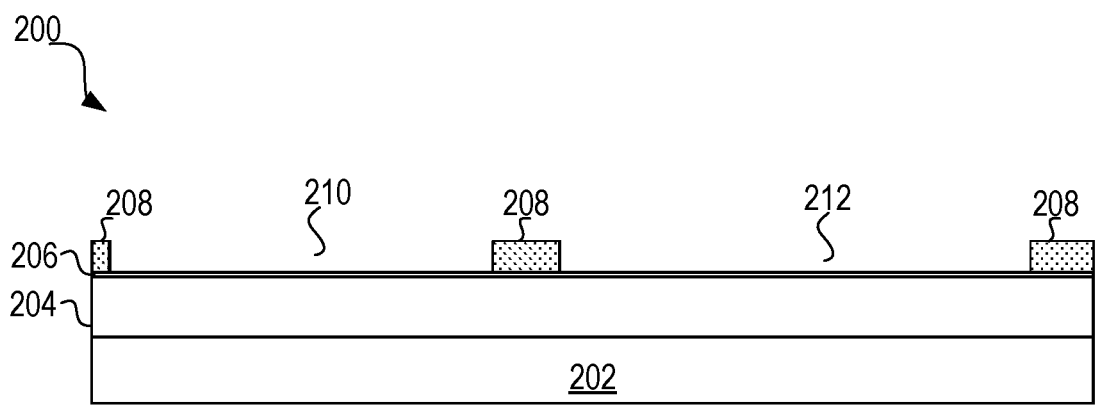
FIGS. 6-10 are cross-sectional views of various intermediate steps of manufacturing a semiconductor device including programmable horizontal interconnects, in accordance with some embodiments.

FIGS. 6-9 illustrate an exemplary single damascene flow to form a programmable horizontal interconnect. As shown in FIG. 6, a substrate segment 200 is provided. The substrate segment 200 has a substrate 202, an insulation layer 204 that is formed over the substrate 202, an etch stop layer 206 that is formed over the insulation layer 204, and a dielectric layer 208 that is formed over the etch stop layer 206. Further, a relief pattern can be formed in the dielectric layer 208 through any suitable manufacturing process, such as a combination of a photolithography process and an etching process. The relief pattern can include a plurality of trenches. For example, two trenches 210 and 212 are included in FIG. 6. In some embodiments, the etch stop layer 206 can includes SiN, SiC, SiCN, AlO, and other suitable materials. The dielectric layer 208 can be made of SiO, or a low K material.

Figure 7:
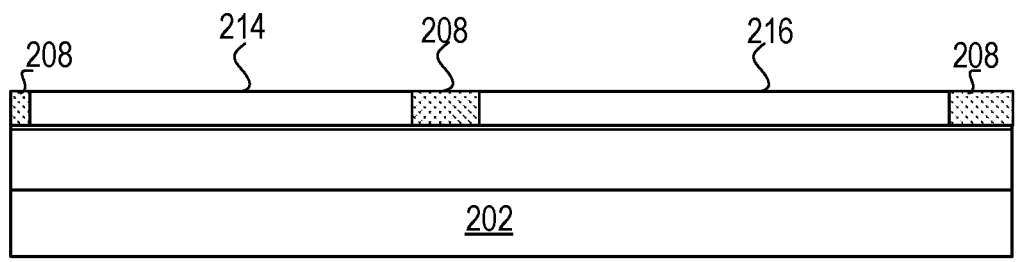

In FIG. 7, the trenches 210 and 212 can then be seeded and filled with a conductive material, such as tungsten, copper, ruthenium, cobalt, by using a suitable deposition process. The deposition process can include a chemical vapor deposition (CVD), a physical vapor deposition, an atomic layer deposition, a diffusion, a sputtering, or other suitable deposition processes. An overburden of the conductive materials (e.g., metal) can be removed by a CMP process from a top surface of the dielectric layer 208. After the CMP process, a plurality of conductive lines can be formed and the conductive lines are spaced apart from each other by the dielectric layer 208. For example, two conductive lines 214 and 216 are included in FIG. 7.

Figure 8:
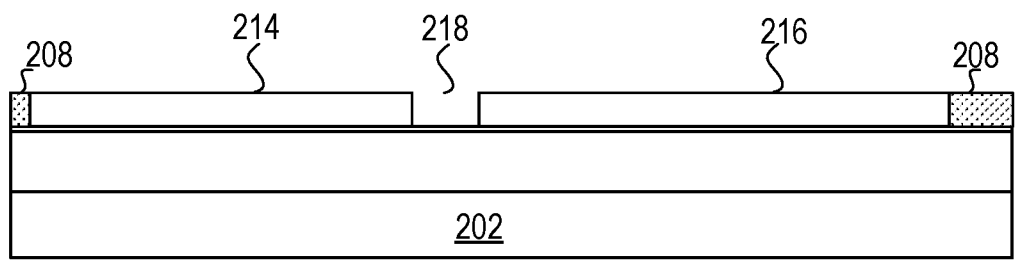

Further, a photoresist mask (not shown) can be used to remove the dielectric layer between conductive lines at selected locations. FIG. 8 illustrates that the dielectric layer 208 positioned between the conductive lines 214 and 216 is removed. In order to remove the dielectric layer 208 between the conductive lines 214 and 216, the photoresist mask can be applied to cover the conductive lines 214 and 216, and leave the dielectric layer 208 between the conductive lines 214 and 216 uncovered. A subsequent etching process can be applied to remove the dielectric layer 208 between the conductive lines 214 and 216. The photoresist mask is then removed by an ashing process and a gap (or a line segment, a trench segment) 218 is formed between the conductive lines 214 and 216.

Figure 9:
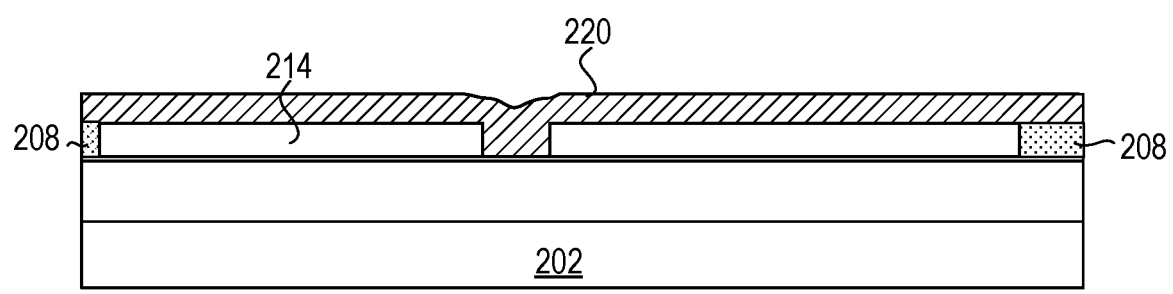

In FIG. 9, a conductive liner (not shown) can optionally be added to fill in the gap 218, and then a phase-changeable material 220 is deposited over the conductive liner to fill the gap 218 fully. The phase-changeable material 220 further covers top surfaces of the conductive lines 214 and 216. The conductive liner can include TiN, TaN, Ta, TiW, Ti, Ru, Au, W, Cu, Pt, CoSi2, NiSi2, TiSi2, Mo, Al, CuAl, CuMn, or other suitable materials. The phase-changeable material 220 that is deposited in FIG. 9 can include InSe, SbSe, SbTe, InSbSe, InSbTe, GeSbSe, GeSbTeSe and AgIn InSe, SbSe, SbTe, InSbSe, InSbTe, GeSbSe, GeSbTeSe, AgIn, Ag2Se, Ge2Se3, GeSb, Ge2Sb2, GeSbTeN, and Ge2Sb2Te5. The phase-changeable material 220 can be deposited in either a crystalline state or amorphous state. Many suitable processes can be applied to form the phase-changeable material, such as CVD (chemical vapor deposition), PVD (physical vapor deposition), diffusion, sputter, and atomic layer deposition (ALD). For example, Ge2Sb2Te5 can be prepared by thermal evaporation of single-element sources at a base pressure of $1 \times 10^{-8}$ mbar.

Figure 10:
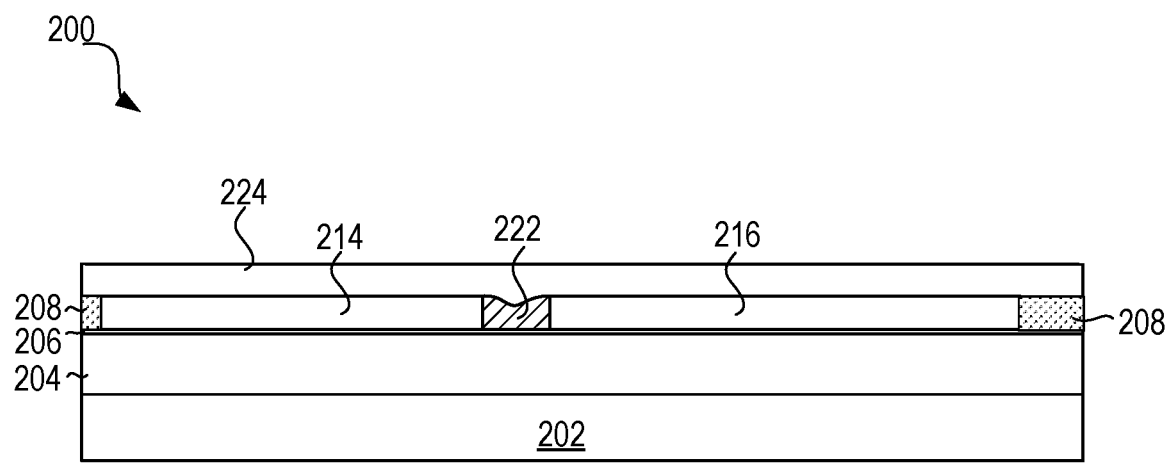

As shown in FIG. 10, the substrate segment 200 can then be processed with an etch back or CMP process to remove any overburden of the phase-changeable material 220 that covers top surfaces of the conductive lines 214 and 216. The phase-changeable material 220 remains in the gap 218 becomes a programmable horizontal bridge 222. In some embodiments, a capping layer (not shown) can optionally be added over the programmable horizontal bridge 222. Further an insulation layer 224 can then be deposited over the programmable horizontal bridge 222, and the conductive lines 214-216. When the insulation layer 224 is formed, conventional microfabrication processes can then be continued to complete a corresponding chip.

Figure 11:
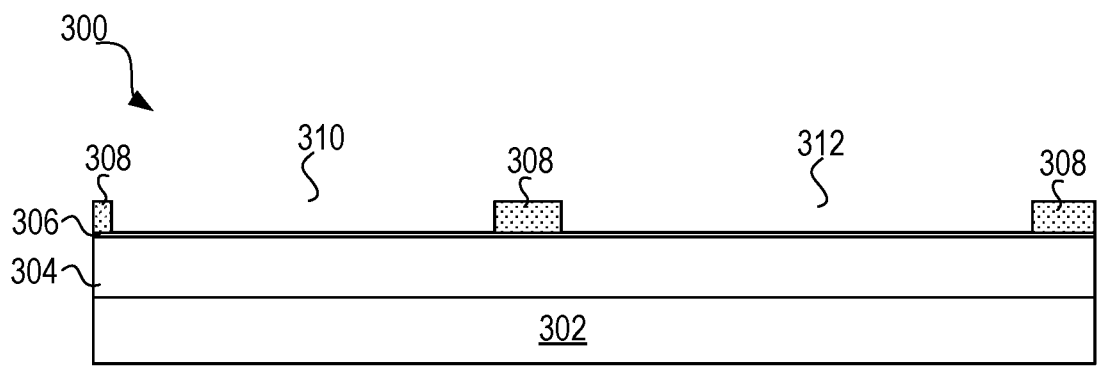
FIGS. 11-15 are cross-sectional and top down views of various intermediate steps of manufacturing another semiconductor device including programmable horizontal interconnects, in accordance with some embodiments.

FIGS. 11-15 illustrate another exemplary flow to form the programmable horizontal bridge. As shown in FIG. 11, a substrate segment 300 is provided. The substrate segment 300 has a substrate 302, an insulation layer 304 formed over the substrate 302, an etch stop layer 306 formed over the insulation layer 304, and a dielectric layer 308 formed over the etch stop layer 306. Further, a relief pattern can be formed in the dielectric layer 308 through any suitable manufacturing process, such as a combination of a photolithography process and an etching process. The relief pattern can include a plurality of trenches. For example, two trenches 310 and 312 are included in FIG. 11. In some embodiments, the etch stop layer 306 can includes SiN, SiC, SiCN, AlO, and other suitable materials. The dielectric layer 308 can be made of SiO, or a low K material.

Figure 12:
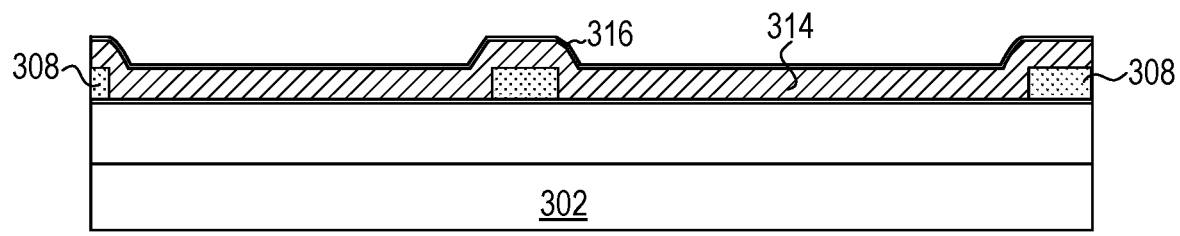

In FIG. 12, a phase-changeable material 314 can be deposited to fill in the trenches 310 and 312. The phase-changeable material 314 can further cover the dielectric layer 308. In some embodiments, a capping layer 316 can be optionally deposited over the phase-changeable material 314. The capping layer can include SiN, SiC, a high-K material, a low-K material, a metal oxide, an ALD metal oxide, or the like. Any suitable process can be applied to form the capping layer, such as a CVD process, a PVD process, a diffusion process, and an ALD process.

Figure 13:
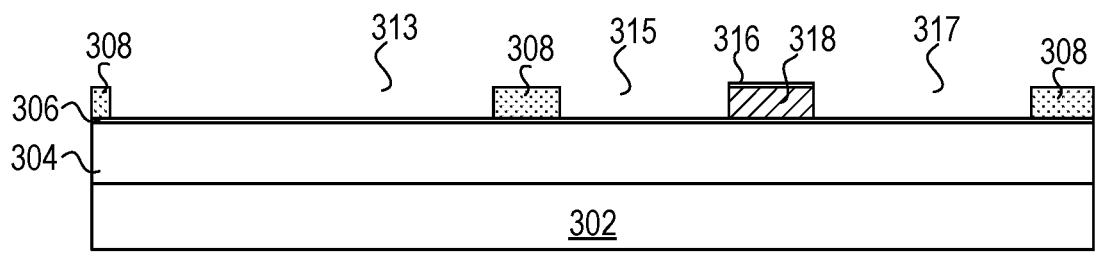

Next, any overburden of the phase-changeable material 314 can be optionally removed. By using a photolithography process, an etch mask can be formed to selectively cover portions of the phase-changeable material that needs to be kept. Then the phase-changeable material 314 can be etched to remove all uncovered portions, and the etch mask and corresponding materials (e.g., etching residuals) can be removed from the substrate segment 300, which leaves a programmable horizontal bridge 318, and a plurality of line segments (or trench segments) 313, 315, 317 that are illustrated in FIG. 13.

Figure 14:
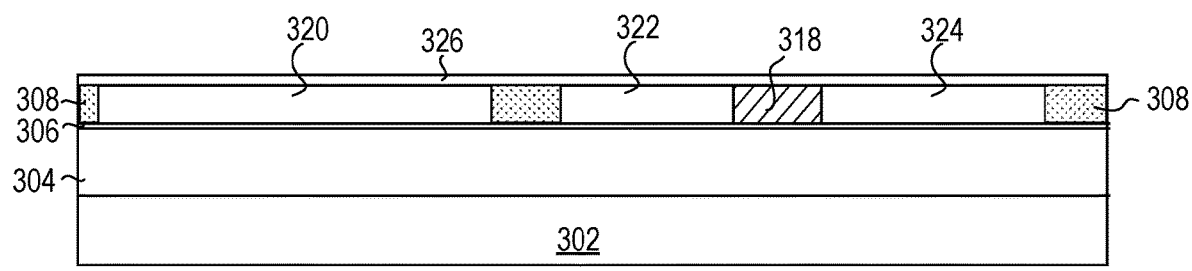

In FIG. 14, the manufacturing process can continue with a metal deposition as a part of a damascene flow. The metal can be deposited to fill in the line segments 313, 315, and 317. The metal can further cover the dielectric layer 308 and the programmable horizontal bridge 318. A surface planarization process (e.g., CMP) can subsequently be applied to remove any overburden of the metal from top surfaces of the dielectric layer 308. The surface planarization process can further remove the capping layer 316 that is formed on the programmable horizontal bridge 318. The metal that remains in the line segments 313, 315, and 317 become a plurality of conductive lines 320, 322, and 324 respectively. In some embodiments, a capping layer 326 can be subsequently formed over the conductive lines and the programmable horizontal bridge 318. Similar to the capping layer 316, the capping layer 326 can be SiN, SiC, a high-K material, a low-K material, a metal oxide, an ALD metal oxide, or the like.

Figure 15:
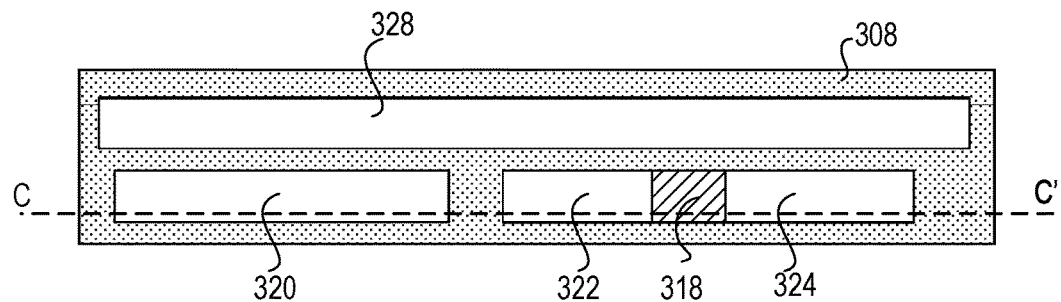

FIG. 15 is a top down view of the substrate segment 300 when the conductive lines are formed. As shown in FIG. 15, the substrate segment 300 can include conductive lines 320, 322, 324, and 328, for example. It should be noted that the cross-sectional view of the substrate segment 300 in FIG. 14 is obtained from a line C-C' along a direction perpendicular to the conductive lines 320, 322, and 324 in FIG. 15. For simplicity and clarity, the capping layer 326 is not shown in FIG. 15.

As can be appreciated, several embodiments are contemplated herein, including a programmable horizontal bridge (also referred to programmable line segment), methods of making, and methods of using. One embodiment is a microelectronic device comprising a first level having a plurality of transistor devices or other semiconductor devices such as capacitors. Multiple wiring levels are formed in different planes relative to the first level. A first wiring level of the multiple wiring levels can be positioned over the first level, and a second wiring level of the multiple wiring levels can be positioned over the first wiring level. The multiple wiring levels include lines of conductive material (or conductive lines) extending parallel to the first level. The wiring levels include vertical interconnects (e.g., vias) that connect given wiring levels to each other. The wiring levels can be formed above and/or below a plane of transistor devices.

A programmable line segment is formed as a segment of a particular line of a given wiring level. The programmable line segment comprises a programmable material having a modifiable resistivity in that the programmable line segment can change between being conductive and non-conductive. When the programmable line segment is programmed, the programmable material itself that forms the programmable line segment can be changed, switched, or "programmed" to function as a conductor or as a non-conductor (resistor), or as a partial conductor. Note that non-conductor herein means that the programmable line segment is resistive to conducting electrical signals of the corresponding microelectronic device relative to a conductive state in which the programmable line segment conducts electricity between two conductive lines or structures. Accordingly, the programmable line segment is a resistivity changeable bridge between two conductors or conductive entities.

The programmable line segment can change between being conductive and non-conductive according to a current pattern delivered to the programmable line segment. The programmable line segment can be formed based on a phase-changeable material. Delivering a first current pattern to the programmable line segment causes the phase-changeable material to become amorphous, while delivering a second current pattern to the programmable line segment causes the phase-changeable material to become crystalline. For example, a given pulse pattern can have short pulse or long pulses and accordingly affect the molecular structure.

The programmable line segment can fill an entire cross-sectional segment of a corresponding line. In other words, metal or conductive material of a line or conductive entity does not form a part of the line segment, such as around an outside portion of the segment, that would enable a signal transmission. Instead, either an entire line segment is removed and replaced with the programmable material, or the programmable material fills a gap between two conductive lines or extends along a conductive line, where the programmable line segment can connect two conductive lines that are less than 500 microns in diameter, or less than 500 nanometers in cross-sectional width.

The programmable line segment can be formed within a given metal layer (or wiring level), or can be formed on two or more metal layers. The programmable line segment can connect two parallel conductive lines that are positioned in a same wiring level, or can replace a segment of a particular conductive line. The programmable line segment can include a second phase-changeable material that is different from the first phase-changeable material in that a resistivity shift is triggered by different current patterns. The first programmable line segment is formed of a first material that changes resistivity in response to a first current pattern, and a second programmable line segment is formed of a second material that changes resistivity in response to a second current pattern. In other words, for example, a bi-layer programmable horizontal bridge is formed. If either of the first and second phase-changeable materials is programmed to be a conductor, then signals can be transmitted across the bi-layer programmable horizontal bridge.

The programmable line segment is positioned at a location to toggle a predetermined function of a corresponding integrated circuit. For example the function can be an individual transistor, standard cell, collection of transistors, redundant circuit, memory array, or larger function on an integrated circuit. As can be appreciated, any number of chip functions can be toggled accordingly.

Another embodiment includes a method of forming a microelectronic device. The method includes forming conductive lines as part of a wiring level of a semiconductor device. Forming a programmable horizontal bridge that physically connects a first conductive line to a second conductive line in the wiring level. The programmable horizontal bridge can be formed by using a first material that can phase change between a conductor and an insulator.

The first material can be deposited in a crystalline state or in an amorphous state. This is beneficial because (depending on a particular phase-changeable material) depositing in a crystalline state can be used for filling smaller spaces, while depositing material as amorphous can be more efficient.

Forming the programmable horizontal bridge includes forming a relief pattern, such as a damascene pattern, in a dielectric material, where the relief pattern includes a plurality of trenches. The first material is deposited to fill the trenches of the relief pattern. Selected portions of the first material are masked (or covered) by using a first mask. Uncovered portions of the first material are removed from the substrate segment. The first mask is removed, and then the trenches are filled with a conductive material.

Forming the programmable horizontal bridge can include depositing a conductive material in trenches to form conductive lines, as well as depositing the first material in a trench segment (or line segment, gap) to physically connect two conductive lines. Depositing the first material in the trench segment can include removing a sacrificial material (e.g., a dielectric material) that fills the trench segment and replacing the sacrificial material with the first material.

Embodiments can include a method of using a microelectronic device. Methods can include accessing a microelectronic device that has an array of transistor devices and a wiring structure including multiple wiring levels having lines of conductive material and vertical interconnects of conductive material that connect given lines of conductive material together. The wiring structure includes at least one programmable horizontal bridge that connects two conductive lines. The programmable horizontal bridge includes a first material having a modifiable resistivity in that the programmable horizontal bridge can change between being conductive and being non-conductive. A specific circuit function to deactivate corresponding to the programmable horizontal bridge is identified. Then a first current pattern is transmitted to the programmable horizontal bridge that causes the programmable horizontal bridge to change from being conductive to being non-conductive, such that the specific circuit function is deactivated. Alternatively, a specific circuit function is identified to activate corresponding to the programmable horizontal bridge. Then a second current pattern is transmitted to the programmable horizontal bridge that causes the programmable horizontal bridge to change from being conductive to being non-conductive, such that the specific circuit function is activated. In other embodiments, a third current pattern is delivered to the programmable horizontal bridge that causes the programmable horizontal bridge to change from being non-conductive to being conductive, such that the specific circuit function is deactivated. A fourth current pattern can be delivered to the programmable horizontal bridge that causes the programmable horizontal bridge to change from being non-conductive to being conductive, such that the specific circuit function is activated.

Accordingly, adding a programmable horizontal bridge between particular conductive lines provide increased device functionality by being able to indefinitely turn on or off specific device function based on whether the programmable horizontal bridge is caused to be a conductor or a non-conductor.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for forming a semiconductor device, the method comprising:
   forming a plurality of conductive lines as a part of a first wiring level of the semiconductor device, the first wiring level being positioned over a first level having a plurality of transistor devices, the plurality of conductive lines extending parallel to the first level; and
   forming a programmable horizontal bridge that extends parallel to the first level, and electrically connects a first conductive line and a second conductive line of the plurality of conductive lines in the first wiring level, the programmable horizontal bridge being formed based on a programmable material that changes phase between a conductive state and a non-conductive state according to a current pattern delivered to the programmable horizontal bridge;
   wherein forming the programmable horizontal bridge includes forming a relief pattern in a dielectric material positioned over a substrate, the relief pattern having a plurality of trenches;
   depositing a first material to fill the plurality of trenches of the relief pattern;
   forming at least one trench segment in the dielectric material, the at least one trench segment being between a first trench and a second trench; and
   filling the at least one trench segment with a second material.

2. The method of claim 1, wherein forming the programmable horizontal bridge comprises:
   depositing the first material to fill the plurality of trenches of the relief pattern, the first material being the programmable material;
   covering a portion of the programmable material by a first mask;
   removing uncovered portions of the programmable material that are not protected by the first mask so that the programmable horizontal bridge is formed based on the covered portion of the programmable material and the at least one trench segment is formed in the dielectric material, the programmable horizontal bridge being positioned between a first trench segment and a second trench segment of the plurality of trench segments;
   removing the first mask; and
   filling the first trench segment and the second trench segment with the second material, the second material being a conductive material to form the first conductive line in the first trench segment and the second conductive line in the second trench segment.

3. The method of claim 2, wherein the programmable material is deposited in a crystalline state.

4. The method of claim 2, wherein the programmable material is deposited in an amorphous state.

5. The method of claim 1, wherein forming the programmable horizontal bridge includes:
   depositing the plurality of trenches with the first material, the first material being a conductive material to form the plurality of conductive lines;
   forming the at least one trench segment between the first conductive line and the second conductive line of the plurality of conductive lines; and
   filling the at least one trench segment with the second material, the second material being the programmable material to form the programmable horizontal bridge that connects the first conductive line and the second conductive line of the plurality of conductive lines in the first wiring level.

6. The method of claim 5, wherein forming the trench segment between the first conductive line and the second conductive line includes:
   forming a mask layer over the first conductive line and the second conductive line; and
   removing the dielectric material positioned between the first conductive line and the second conductive line to form the trench segment.

7. The method of claim 1, further comprising:
   forming a capping layer on the programmable horizontal bridge.

8. A method for operating a semiconductor device, the method comprising:
   transmitting a current pattern to one or more programmable horizontal bridges of a semiconductor device that has a first level including a plurality of transistor devices over a substrate and a first wiring level positioned over the first level, the first wiring level including a plurality of conductive lines extending parallel to the first level, and the one or more programmable horizontal bridges extending parallel to the first level, each of the one or more programmable horizontal bridges electrically connecting two respective conductive lines of the plurality of conductive lines in the first wiring level, the one or more programmable horizontal bridges including a programmable material having a modifiable resistivity in that the one or more programmable horizontal bridges change between being conductive and being non-conductive; and
   identifying a specific circuit function to operate the one or more programmable horizontal bridges based on the current pattern transmitted to the one or more programmable horizontal bridges,
   a first programmable horizontal bridge of the one or more programmable horizontal bridges being positioned between a first conductive line and a second conductive line of the plurality of conductive lines in the first wiring level along a first direction that is parallel to the substrate,
   the first programmable horizontal bridge further extending between the first conductive line and the second conductive line along a second direction that is parallel to the substrate and perpendicular to the first direction,
   a first sidewall of the first programmable horizontal bridge being positioned at a first side of the first conductive line and extending away from a first sidewall of the first conductive line along the second direction, and
   a second sidewall of the first programmable horizontal bridge being positioned at a second side of the first conductive line and extending away from a second sidewall of the first conductive line along the second direction.

9. The method of claim 8, wherein the specific circuit function indicates one of:
   a first specific circuit function to deactivate the one or more programmable horizontal bridges by transmitting a first current pattern to the one or more programmable horizontal bridges that causes the one or more programmable horizontal bridges to change from being conductive to being non-conductive, such that the specific circuit function is deactivated;
   a second specific circuit function to activate the one or more programmable horizontal bridges by transmitting a second current pattern to the one or more programmable horizontal bridges that causes the one or more programmable horizontal bridges to change from being conductive to being non-conductive, such that the specific circuit function is activated;

a third specific circuit function to deactivate the one or more programmable horizontal bridges by transmitting a third current pattern to the one or more programmable horizontal bridges that causes the one or more programmable horizontal bridges to change from being non-conductive to being conductive, such that the specific circuit function is deactivated; and a fourth specific circuit function to activate the one or more programmable horizontal bridges by transmitting a fourth current pattern to the one or more programmable horizontal bridges that causes the one or more programmable horizontal bridges to change from being non-conductive to being conductive, such that the specific circuit function is activated.

10. The method of claim 8, wherein the programmable material is a phase-changeable material that changes between being conductive and being non-conductive according to the current pattern delivered to the one or more programmable horizontal bridges.

11. A method for forming a semiconductor device, the method comprising:

forming a plurality of conductive lines as a part of a first wiring level of the semiconductor device, the first wiring level being positioned over a first level having a plurality of transistor devices, the plurality of conductive lines extending parallel to the first level; and forming a programmable horizontal bridge that extends parallel to the first level, and electrically connects a first conductive line and a second conductive line of the plurality of conductive lines in the first wiring level, the programmable horizontal bridge being formed based on a programmable material that changes phase between a conductive state and a non-conductive state according to a current pattern delivered to the programmable horizontal bridge;

wherein forming the programmable horizontal bridge includes forming a relief pattern in a dielectric material positioned over a substrate, the relief pattern having a plurality of trenches;

depositing the programmable material to fill the plurality of trenches of the relief pattern;

covering a portion of the programmable material by a first mask;

removing uncovered portions of the programmable material that are not protected by the first mask so that the programmable horizontal bridge is formed based on the covered portion of the programmable material and a plurality of trench segments are formed in the dielectric material, the programmable horizontal bridge being positioned between a first trench segment and a second trench segment of the plurality of trench segments;

removing the first mask; and filling the first trench segment and the second trench segment with a conductive material to form the first conductive line in the first trench segment and the second conductive line in the second trench segment.

12. The method of claim 11, wherein the programmable material is deposited in a crystalline state.

13. The method of claim 11, wherein the programmable material is deposited in an amorphous state.

14. A method for forming a semiconductor device, the method comprising:

forming a plurality of conductive lines as a part of a first wiring level of the semiconductor device, the first wiring level being positioned over a first level having a plurality of transistor devices, the plurality of conductive lines extending parallel to the first level; and forming a programmable horizontal bridge that extends parallel to the first level, and electrically connects a first conductive line and a second conductive line of the plurality of conductive lines in the first wiring level, the programmable horizontal bridge being formed based on a programmable material that changes phase between a conductive state and a non-conductive state according to a current pattern delivered to the programmable horizontal bridge;

wherein forming the programmable horizontal bridge includes forming a relief pattern in a dielectric material positioned over a substrate, the relief pattern having a plurality of trenches;

depositing the plurality of trenches with a conductive material to form the plurality of conductive lines;

forming a trench segment between the first conductive line and the second conductive line of the plurality of conductive lines; and filling the trench segment with the programmable material to form the programmable horizontal bridge that connects the first conductive line and the second conductive line of the plurality of conductive lines in the first wiring level.

15. The method of claim 14, wherein forming the trench segment between the first conductive line and the second conductive line includes:

forming a mask layer over the first conductive line and the second conductive line; and removing the dielectric material positioned between the first conductive line and the second conductive line to form the trench segment.

* * * * *